(12) United States Patent
Yuan et al.

(10) Patent No.: US 11,825,700 B2
(45) Date of Patent: Nov. 21, 2023

(54) ARRAY SUBSTRATE AND FABRICATING METHOD THEREOF, DISPLAY PANEL, AND DISPLAY APPARATUS

(71) Applicants: Hefei BOE Joint Technology Co., Ltd., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN)

(73) Assignees: Hefel BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/680,790

(22) Filed: Feb. 25, 2022

(65) Prior Publication Data

US 2022/0278182 A1 Sep. 1, 2022

Related U.S. Application Data

(63) Continuation of application No. 16/638,556, filed as application No. PCT/CN2019/104385 on Sep. 4, 2019, now Pat. No. 11,296,162.

(30) Foreign Application Priority Data

Mar. 28, 2019 (CN) .................... 201910244376.X

(51) Int. Cl.
*H10K 59/123* (2023.01)
*H10K 59/122* (2023.01)
(Continued)

(52) U.S. Cl.
CPC ......... *H10K 59/123* (2023.02); *H10K 59/122* (2023.02); *H10K 71/00* (2023.02);
(Continued)

(58) Field of Classification Search
None
See application file for complete search history.

(56) References Cited

U.S. PATENT DOCUMENTS 7,692,197 B2 4/2010 Park et al.
10,069,098 B2 9/2018 Kim et al.
(Continued)

FOREIGN PATENT DOCUMENTS

CN 103792746 A 5/2014
CN 106098710 A 11/2016
(Continued)

OTHER PUBLICATIONS

CN201910244376.X first office action.
PCT/CN2019/104385 international search report.
U.S. Appl. No. 16/638,556 first office action.

*Primary Examiner* — Michelle Mandala
(74) *Attorney, Agent, or Firm* — IPro, PLLC

(57) ABSTRACT

The present disclose is related to an array substrate. The array substrate may include a base substrate; a driving transistor on the base substrate; an insulating layer on the driving transistor, the insulating layer comprising a via hole above a first electrode of the driving transistor; a conductive portion on the insulating layer; and a light emitting device on the conductive portion and electrically connected to the conductive portion. The conductive portion may be electrically connected to the first electrode of the driving transistor through the via hole. The light emitting device may be above the via hole, and an orthographic projection of the light emitting device on the base substrate may cover an orthographic projection of the via hole on the base substrate.

17 Claims, 15 Drawing Sheets

(51) Int. Cl.
  *H10K 71/00* (2023.01)
  *H10K 71/13* (2023.01)
  *H10K 71/20* (2023.01)
  *H10K 59/12* (2023.01)

(52) U.S. Cl.
  CPC ............ *H10K 71/13* (2023.02); *H10K 71/233* (2023.02); *H10K 59/1201* (2023.02)

(56) References Cited

U.S. PATENT DOCUMENTS

| | | |
|---|---|---|
| 2005/0082534 A1 | 4/2005 | Kim et al. |
| 2007/0257606 A1* | 11/2007 | Winters ................ H01L 27/124 |
| | | 313/505 |
| 2015/0205418 A1* | 7/2015 | Nam ..................... G06F 3/0446 |
| | | 345/174 |
| 2016/0005767 A1 | 1/2016 | Shen |
| 2016/0104863 A1 | 4/2016 | Park |
| 2019/0294280 A1 | 9/2019 | Zeng |
| 2019/0377445 A1* | 12/2019 | Jeong ...................... G06F 3/047 |
| 2020/0035773 A1 | 1/2020 | Cheng |
| 2021/0233982 A1 | 7/2021 | Yuan et al. |

FOREIGN PATENT DOCUMENTS

| | | |
|---|---|---|
| CN | 107452780 A | 12/2017 |
| CN | 107579089 A | 1/2018 |
| CN | 108364993 A | 8/2018 |
| CN | 109037282 A | 12/2018 |
| CN | 109904211 A | 6/2019 |
| KR | 100543009 B1 | 1/2006 |
| KR | 20130105161 A | 9/2013 |

\* cited by examiner

Related Art

Related Art

ARRAY SUBSTRATE AND FABRICATING METHOD THEREOF, DISPLAY PANEL, AND DISPLAY APPARATUS

CROSS-REFERENCE TO RELATED APPLICATIONS

This application is a continuation of U.S. patent application Ser. No. 16/638,556, field on Feb. 12, 2020, which claims benefit of the filing date of Chinese Patent Application No. 201910244376.X filed on Mar. 28, 2019, the disclosure of which is hereby incorporated in its entirety by reference.

TECHNICAL FIELD

The present disclosure relates to the display technologies and, more particularly, to an array substrate, a fabricating method thereof, a display panel, and a display apparatus.

BACKGROUND

With the development of display technology, people have higher and higher requirements on the quality of display panels. For the OLED display panel based on the printing method, the position of the light-emitting device on the array substrate is greatly limited, thereby affecting the service life of the display panel.

BRIEF SUMMARY

One embodiment of the present disclosure is an array substrate. The array substrate may include a base substrate; a driving transistor on the base substrate; an insulating layer on the driving transistor, the insulating layer comprising a via hole above a first electrode of the driving transistor; a conductive portion on the insulating layer; and a light emitting device on the conductive portion and electrically connected to the conductive portion. The conductive portion may be electrically connected to the first electrode of the driving transistor through the via hole. The light emitting device may be above the via hole, and an orthographic projection of the light emitting device on the base substrate may cover an orthographic projection of the via hole on the base substrate.

Optionally, the array substrate may further comprise a filling portion on the conductive portion and filled in the via hole, wherein the light emitting device is on the filling portion.

Optionally, a surface of a part of the conductive portion opposite from the base substrate outside an area where the via hole is located is substantially flush with a surface of the filling portion in the via hole opposite from the base substrate.

Optionally, the light emitting device comprises an anode layer, a light emitting function layer, and a cathode layer sequentially on the filling portion and the conductive portion; and an orthographic projection of the anode layer on the base substrate covers the orthographic projection of the via hole on the base substrate.

Optionally, the orthographic projection of the anode layer on the base substrate completely overlaps an orthographic projection of the conductive portion on the base substrate.

Optionally, the array substrate further comprises a pixel defining layer, wherein an orthographic projection of the open area of the pixel defining layer on the base substrate covers the orthographic projection of the via hole on the base susbtrate.

Optionally, the orthographic projection of the anode layer on the base substrate covers the orthographic projection of the open area of the pixel defining layer on the base substrate.

Optionally, an orthographic projection of the filling portion on the base substrate overlaps an orthographic projection of the driving resistor on the base susbtrate, and the orthographic projection of the open area of the pixel defining layer overlaps the orthographic projection of the driving resistor on the base susbtrate.

Optionally, the insulating layer comprises a passivation layer and a resin layer sequentially on the driving transistor.

Optionally, the filling portion comprises a resin material.

Optionally, the resin layer of the insulating layer comprises a first photoresist, the resin material of the filling portion comprising a second photoresist, and the first photoresist is one of a positive photoresist or a negative photoresist, and the second photoresist is the other one of the positive photoresist or the negative photoresist.

Optionally, the via hole comprises a first via hole in the passivation layer and a second via hole in the resin layer, and a diameter of the first via hole is smaller than a diameter of the second via hole.

Optionally, the conductive portion is on side walls of the first via hole and the second via hole.

Optionally, the array substrate comprises a plurality of light emitting devices arranged in an array; and a space between two adjacent rows of the light emitting devices comprises a driving transistor for driving one of the two adjacent rows of light emitting devices and another driving transistor for driving the other one of the two adjacent rows of light emitting devices.

One embodiment of the present disclosure is a method for fabricating an array substrate. The method may include forming a driving transistor on a base substrate; forming an insulating layer on the driving transistor; forming a via hole in the insulating layer at a position corresponding to a first electrode of the driving transistor; forming a conductive portion on the insulating layer after forming the via hole, the conductive portion being connected to the first electrode of the driving transistor through the via hole; forming a filling portion in the via hole; and forming a light emitting device electrically connected to the conductive portion on the filling portion and the conductive portion, wherein an orthographic projection of the light emitting device on the base substrate covers an orthographic projection of the via hole on the base substrate.

Optionally, forming the light emitting device electrically connected to the conductive portion on the filling portion and the conductive portion comprises: forming an anode layer, a light emitting functional layer and a cathode layer sequentially on the filling portion and the conductive portion; wherein the anode layer and the conductive portion are formed by a same first mask, and the light emitting functional layer is formed by a printing process.

Optionally, a surface of a part of the conductive portion opposite from the base substrate outside an area where the via hole is located is flush with a surface of the filling portion in the via hole opposite from the base substrate.

Optionally, forming the insulating layer and the filling portion comprises: performing an exposing and developing process on the insulating layer using a second mask to form a pattern of the insulating layer having the via hole, thereby forming a resin layer, wherein a photoresist coated before the insulating layer is exposed and developed is a first photoresist; forming a resin film layer on a side of the insulating layer opposite from the base substrate; and performing another exposing and developing process on the resin film layer using the second mask to form a pattern of the filling portion in the via hole, thereby forming a resin material, wherein a photoresist coated before the resin film layer is exposed and developed is a second photoresist; the first photoresist is one of a positive photoresist or a negative photoresist, and the second photoresist is the other one of the positive photoresist or the negative photoresist.

Another embodiment of present disclosure is a display panel, comprising the array substrate according to one embodiment of the present disclosure.

Another embodiment of present disclosure a display apparatus, comprising the display panel according to one embodiment of the present disclosure.

BRIEF DESCRIPTION OF THE DRAWINGS

The drawings are used to provide a further understanding of the technical solutions of the present disclosure, and constitute a part of the specification, which together with the embodiments of the present disclosure are used to explain the technical solutions of the present disclosure, and do not constitute a limitation of the technical solutions of the present disclosure. Obviously, the drawings in the following description are only some embodiments of the present disclosure, and those skilled in the art can obtain other drawings according to these drawings without any creative work.

DETAILED DESCRIPTION

Figure 1:
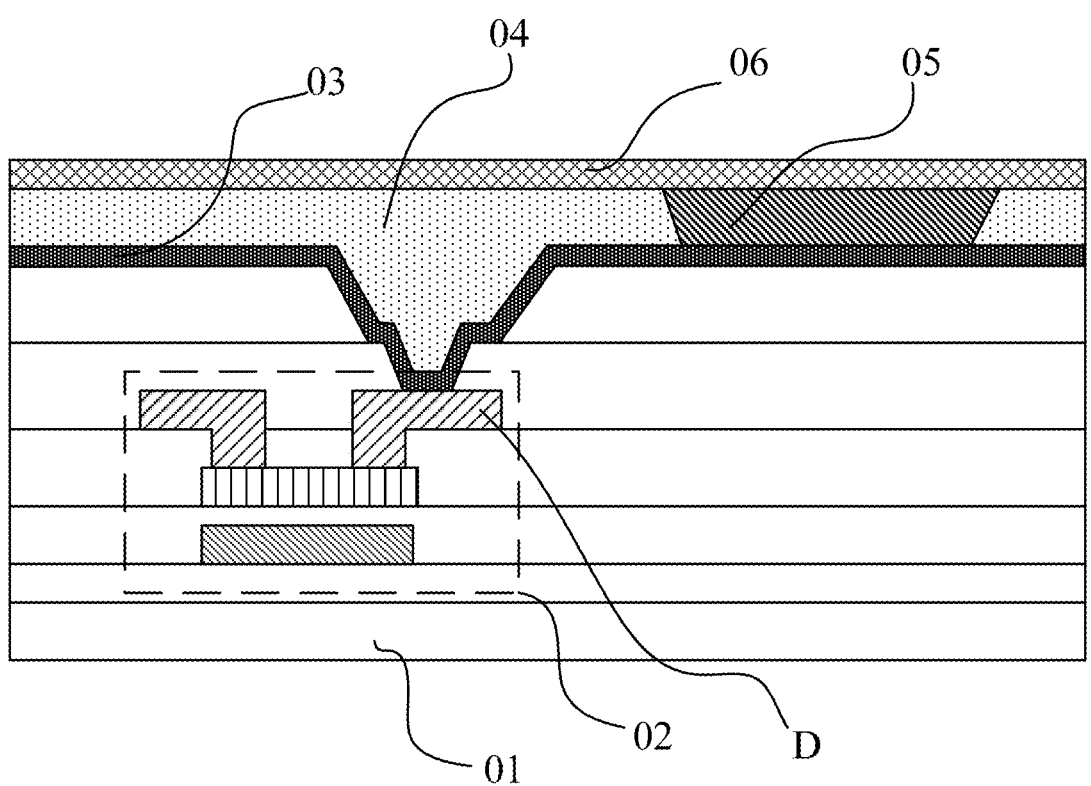
FIG. 1 is a schematic structural view of an array substrate in the related art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-7. When referring to the figures, like structures and elements shown throughout are indicated with like reference numerals.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects.

In the description of the following embodiments, specific features, structures, materials or characteristics may be combined in any suitable manner in any one or more embodiments or examples.

In the related art, an anode of a light emitting device is electrically connected to a first electrode of a driving transistor for driving the light emitting device through a via hole provided on the array substrate. Due to the presence of the via hole, a fault is formed when the subsequent film layer is formed, and the area from the location of the fault to the region where the via hole is located cannot be set as the opening area of the pixel, thereby resulting in a decrease in the aperture ratio of the pixel.

FIG. 1 is a schematic structural view of an array substrate in the related art. The array substrate in the related art, as shown in FIG. 1, includes: a base substrate 01, a driving transistor 02 on the base substrate 01, and an anode layer 03 electrically connected to a first electrode D of the driving transistor 02 through a via hole provided on the insulating layer. Due to the existence of the via hole, if the opening area of the pixel is disposed in the area where the via hole is located, the light-emitting function layer 05 may have a fault, which may affect the performance of the light-emitting device. Therefore, the opening area of the pixel defined by the pixel defining layer 04 cannot be disposed in the area where the via hole is located. That is, the area where the light emitting function layer 05 is located does not overlap with the area where the via hole is located. The cathode layer 06 is formed on the light emitting function layer 05, thereby forming a complete light emitting device. Such a design has a large restriction on the opening area of the pixel due to the existence of the via hole, which seriously affects the opening area of the pixel, thereby lowering the utility lifetime of the pixel.

Embodiments of the present disclosure provide an array substrate, a fabricating method thereof, a display panel, and a display device. The present disclosure will be further described in detail with reference to the accompanying drawings. It is apparent that the described embodiments are only a part of the embodiments of the disclosure, and not all of the embodiments. All other embodiments obtained by a person of ordinary skill in the art based on the embodiments of the present disclosure without creative efforts are within the scope of the present disclosure.

The shapes and sizes of the various components in the drawings do not reflect the true proportions, and are merely intended to illustrate the contents of the present disclosure.

Figure 2:
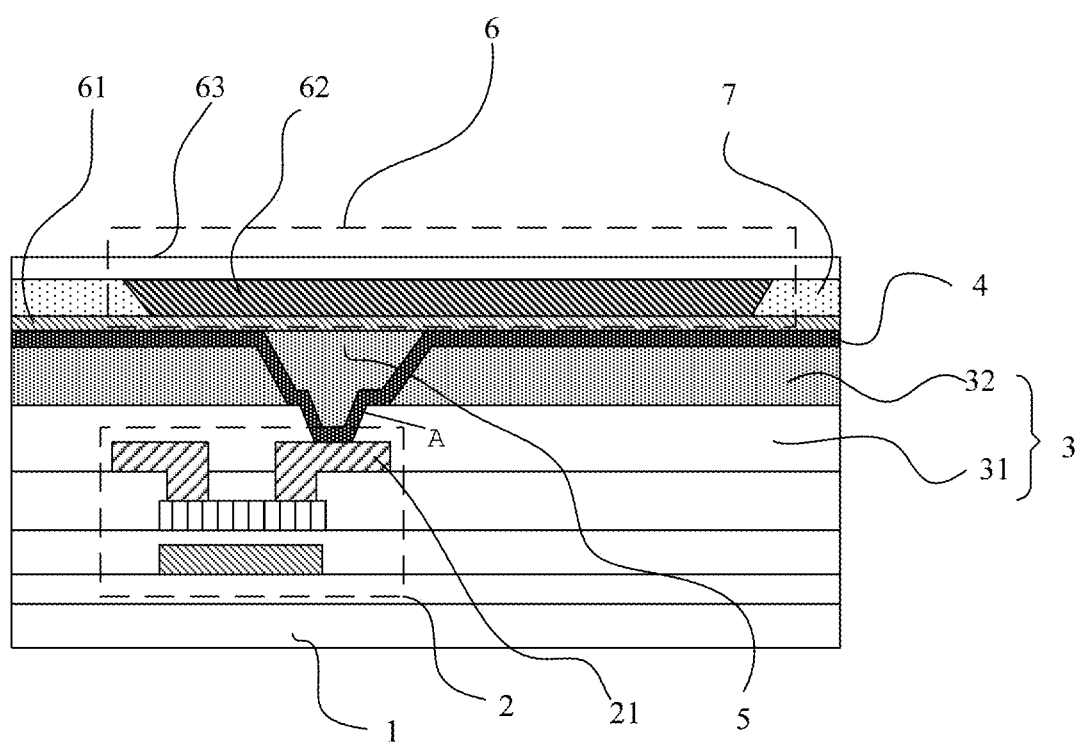
FIG. 2 is a schematic cross-sectional structural view of an array substrate according to one embodiment of the present disclosure.

As shown in FIG. 2, one embodiment of the present disclosure provides an array substrate including a base substrate 1, a driving transistor 2 on the base substrate 1, and an insulating layer 3 on the driving transistor 2. The insulating layer 3 has a via hole A on the first electrode 21 of the driving transistor 2. The array substrate further includes a conductive portion 4 on the insulating layer 3, a filling portion 5 located on the conductive portion 4 and filled in the via hole A, and a light-emitting device 6 located on the filling portion 5 and the conductive portion 4 and electrically connected to the conductive portion 4. The conductive portion 4 is connected to the first electrode 21 of the driving transistor 2 through the via hole A. The orthographic projection of the light-emitting device 6 on the base substrate 1 covers the orthographic projection of the via hole on the base substrate 1.

Optionally, in the array substrate provided by one embodiment of the present disclosure, the via hole can be filled by the filling portion to form a flattened plane composed of the filling portion and the conductive portion. Then, a light-emitting device electrically connected to the conductive portion is formed on the plane, so that the light-emitting device can be disposed in an area where the via hole is located, thereby increasing the aperture ratio of the pixel and effectively improving the service life of the display panel.

Optionally, in the array substrate provided by one embodiment of the present disclosure, as shown in FIG. 2, the conductive portion 4 is located on a surface of the insulating layer opposite from the base substrate at portions other than the area where the via hole is located, and a surface of the conductive portion opposite from the base substrate at portions other than the area where the via hole is located is flush with the surface of the filling portion 5 opposite from the base substrate.

Optionally, in the array substrate provided by one embodiment of the present disclosure, since the light-emitting device has higher requirements on planarization of the surface on which the light-emitting device is disposed, the flatter the surface is, the more stable the performance of the light-emitting device is, and the more uneven the surface is, the more influence it has on the performance of light-emitting device. Therefore, when the pattern of the filling portion is formed, the surface of the filling portion should be flush or substantially flush with the surface of the conductive portion at the region outside the area 22 whether via hole is located, as shown in FIG. 3g, to provide a flat surface for the subsequent fabrication of the light emitting device.

Optionally, although the surface of the filling portion and the surface of the conductive portion located at the non-opening region are completely flush so that the requirements of the light emitting device can be better satisfied, but due to the limitation of the process level, the surface of the filling portion cannot be completely flush with the surface of the conductive portion located in the non-opening region, and there may be a certain error between the two surfaces. That is, the surface of the filling portion is substantially flush with the surface of the conductive portion located in the non-opening region. Since the error is small, it may be neglected in the actual manufacturing process.

Optionally, in the array substrate provided by one embodiment of the present disclosure, an orthographic projection of the anode layer on the base substrate covers an orthographic projection of the via hole on the base substrate.

Specifically, in the array substrate provided by one embodiment of the present disclosure, the orthographic projection of the via hole on the base substrate is located within the orthographic projection of the anode layer on the base substrate, so that the position of the light-emitting device can be set in the area where the via hole is located. Accordingly, the aperture ratio of the array substrate is increased as compared to that in the related art.

Optionally, in the array substrate provided by one embodiment of the present disclosure, as shown in FIG. 2, the light emitting device 6 includes an anode layer 61, a light emitting function layer 62, and a cathode layer 63 which are sequentially located on the filling portion 5 and the conductive portion 4.

Optionally, the orthographic projection of the anode layer 63 on the base substrate 1 completely overlaps with the orthographic projection of the conductive portion 4 on the base substrate 1. Specifically, in the array substrate provided by one embodiment of the present disclosure, the conductive portion and the anode layer can be formed by using a same mask, which can reduce the number of the masks, thereby saving production cost.

Optionally, the array substrate provided by one embodiment of the present disclosure, as shown in FIG. 2, further comprises: a pixel defining layer 7. The orthographic projection of the anode layer 61 on the base substrate 1 covers the orthographic projection of the opening region of the pixel defining layer 7 on the base substrate 1.

Optionally, an orthographic projection of the filling portion on the base substrate overlaps an orthographic projection of the driving resistor on the base susbtrate, and the orthographic projection of the open area of the pixel defining layer overlaps the orthographic projection of the driving resistor on the base susbtrate.

Specifically, in the array substrate provided by one embodiment of the present disclosure, due to the presence of the filling portion, after the anode layer is formed, the opening region defined by the pixel defining layer may be disposed in the area where the via hole is located, so that the area of the opening region is increased by 20% to 30% compared with the area of the opening region when it cannot be disposed on the area where via hole is located in the related art.

Optionally, in the array substrate provided by one embodiment of the present disclosure, as shown in FIG. 2, the insulating layer 3 includes a passivation layer 31 and a resin layer 32 which are sequentially disposed on the driving transistor 2.

In one embodiment, the material used for the passivation layer is a silicon oxynitride material, which can protect the metal layer where the first electrode of the source is located, and block the water and oxygen. The arrangement of the resin layer can make the surface after the formation of the resin layer more flat, which is advantageous for the fabrication of the light-emitting device.

Optionally, the via hole comprises a first via hole in the passivation layer and a second via hole in the resin layer, and a diameter of the first via hole is smaller than a diameter of the second via hole. The conductive portion is on side walls of the first via hole and the second via hole.

Optionally, in the array substrate provided by one embodiment of the present disclosure, the filling portion is a resin material.

Specifically, in the array substrate provided by one embodiment of the present disclosure, the filling portion is made of a resin material, so that the surface after filling the via holes is more flat, which is beneficial to the fabrication of the light emitting device.

Optionally, the resin layer of the insulating layer comprises a first photoresist, the resin material of the filling portion comprising a second photoresist, and the first photoresist is one of a positive photoresist or a negative photoresist, and the second photoresist is the other one of the positive photoresist or the negative photoresist.

Figure 6:
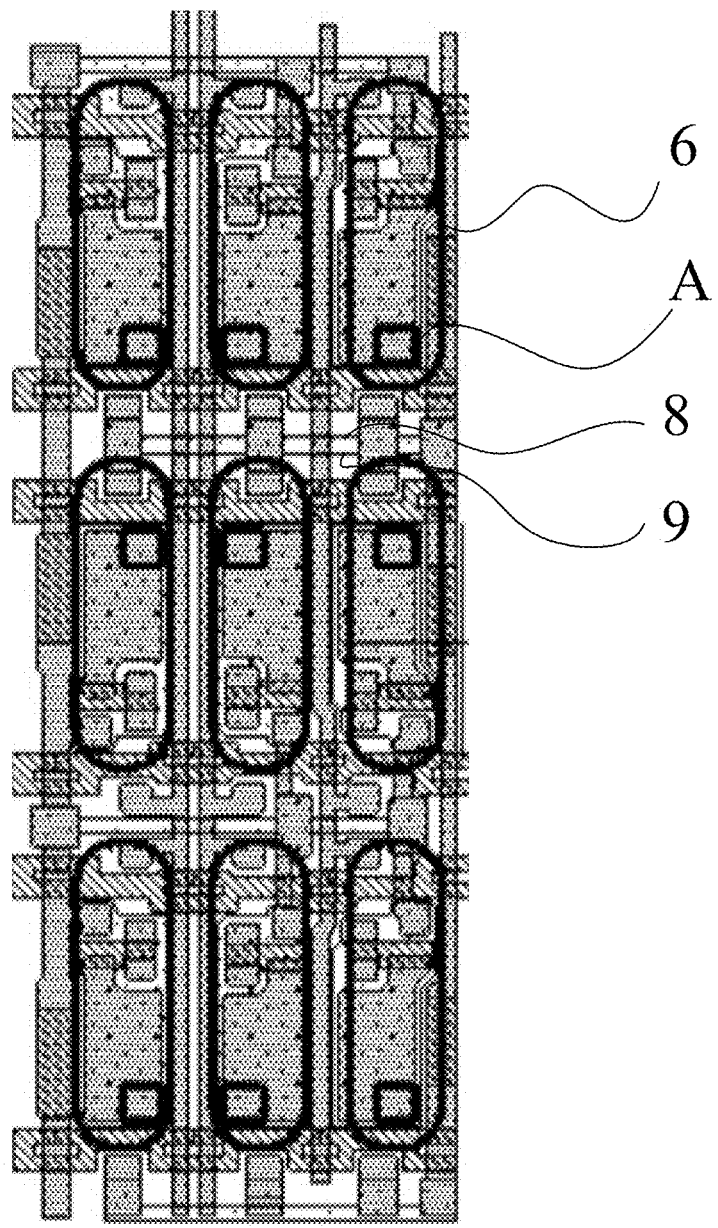
FIG. 6 is a schematic planar structure of an array substrate according to one embodiment of the present disclosure.

Optionally, as shown in FIG. 6, the array substrate includes a plurality of light emitting devices 6 arranged in an array. Between two adjacent rows of light emitting devices 6 is provided with a driving transistor for driving one row of light emitting devices 6 and a other driving transistor for driving the other row of light emitting devices 6.

Specifically, in the array substrate provided by one embodiment of the present disclosure, since the light emitting device can be disposed in an area where the via hole is located, the position of the via hole can be randomly selected without affecting the performance of the light emitting device. Therefore, the driving transistors for driving the two adjacent rows of light emitting devices can be located between the two adjacent rows of light emitting devices to save the space where the driving transistors are located.

Optionally, in the array substrate, the light emitting device may be a top emission type light emitting device, wherein the top emission type light emitting device means that the light emitting surface of the light emitting device is located opposite from the base substrate.

Optionally, the array substrate further includes a power signal line 8 and a detection signal line 9 connected to the driving transistor.

In one embodiment, the power signal line 8 and the detection signal line 9 extending in the row direction are located between two adjacent rows of light-emitting devices 6, and the two adjacent rows of light-emitting devices 6 share the power signal line 8 and the detection signal line 9.

Specifically, in the array substrate provided by one embodiment of the present disclosure, the two adjacent rows of the light emitting devices can share the power signal line and the detection signal to reduce the number of the power signal lines and the detection signal lines, thereby simplifying the wiring of the array substrate. The power signal line may provide a high level signal or a low level signal, which provides a fixed voltage to a circuit for driving the light emitting device.

Figure 3A:
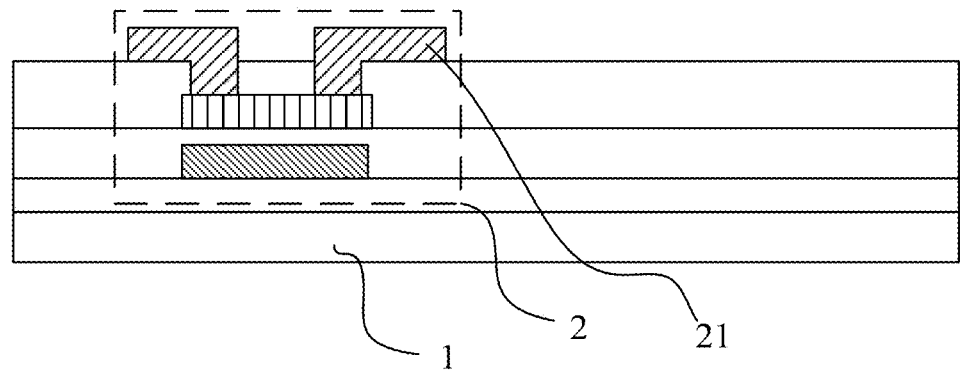
FIGS. 3a to 3j are schematic structural diagrams showing a method of fabricating an array substrate according to one embodiment of the present disclosure.
Figure 3B:
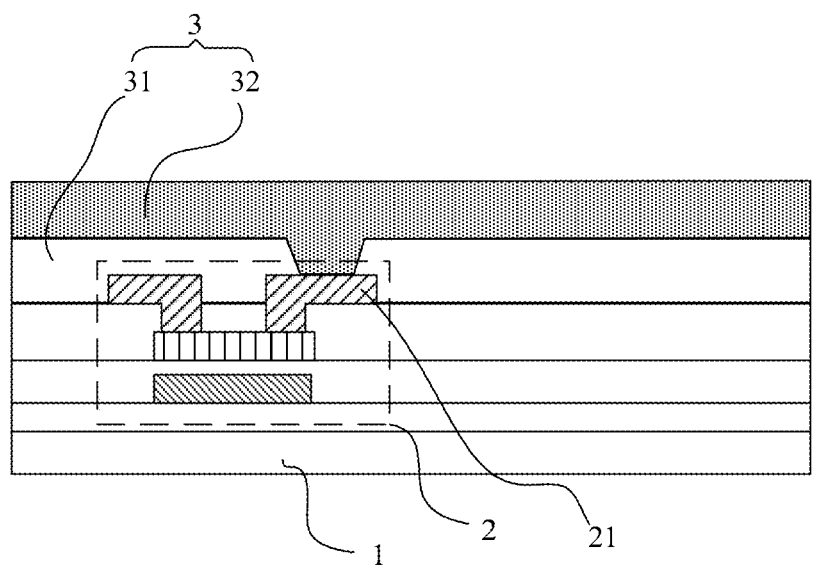
Figure 3C:
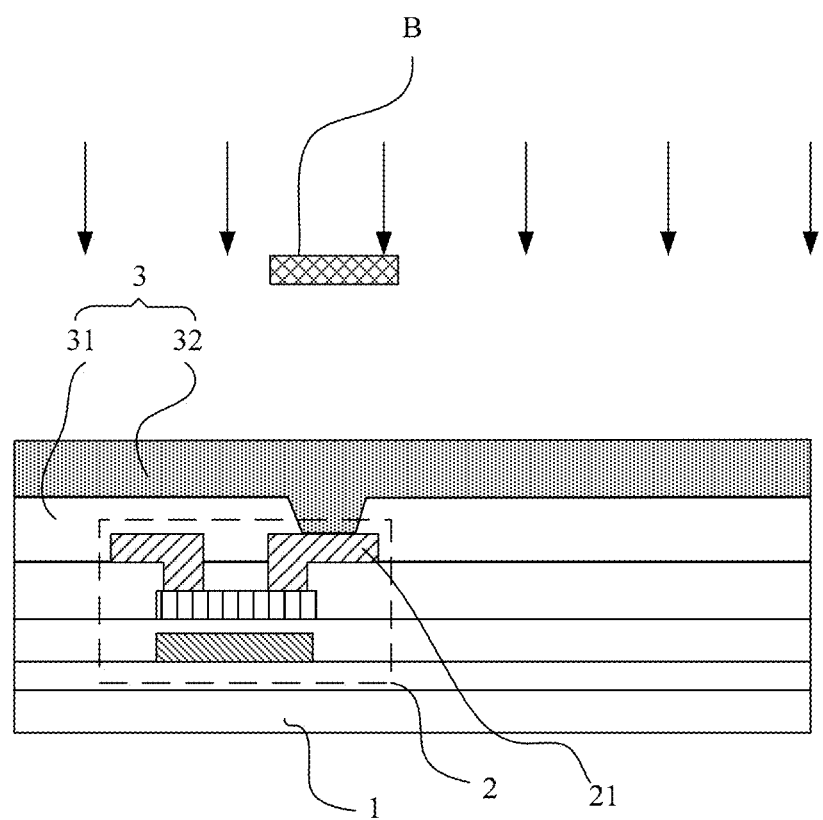
Figure 3D:
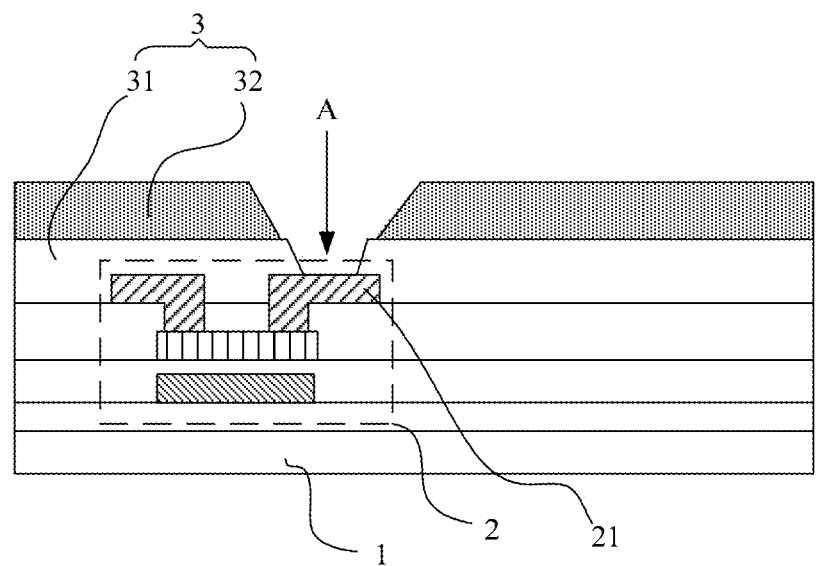
Figure 3E:
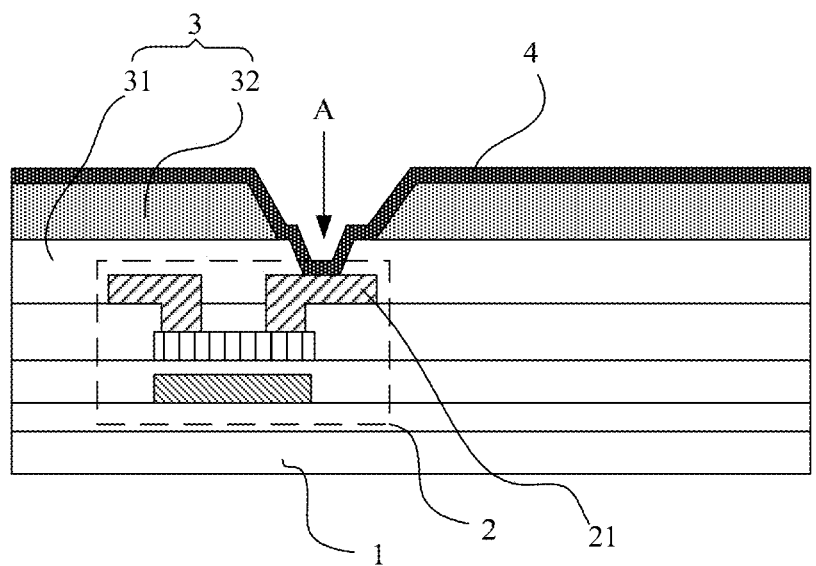
Figure 3F:
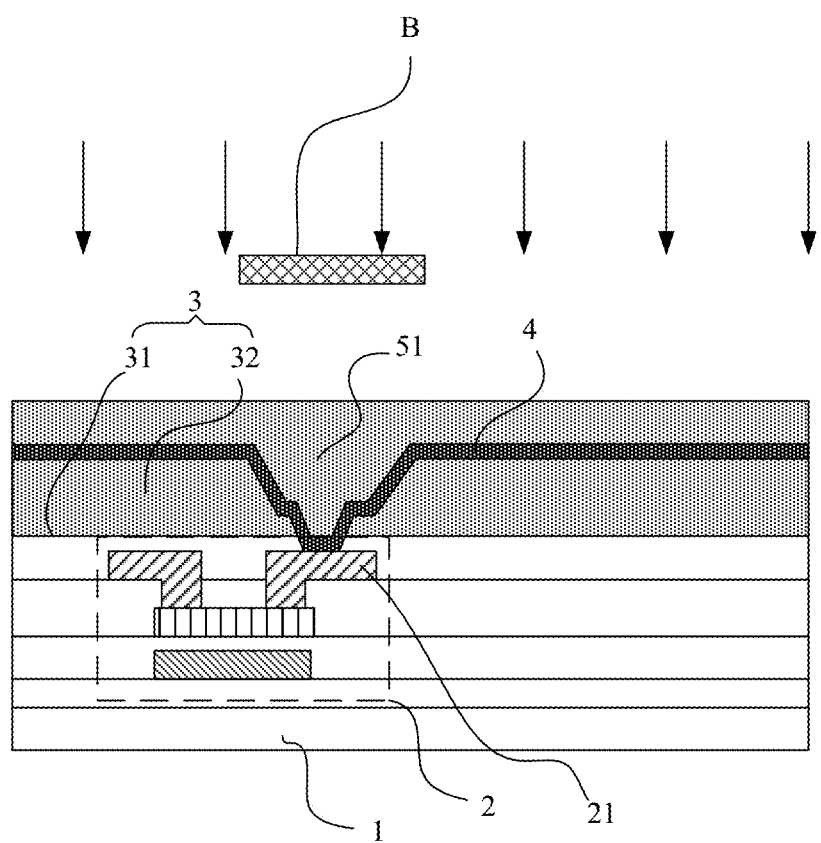
Figure 3G:
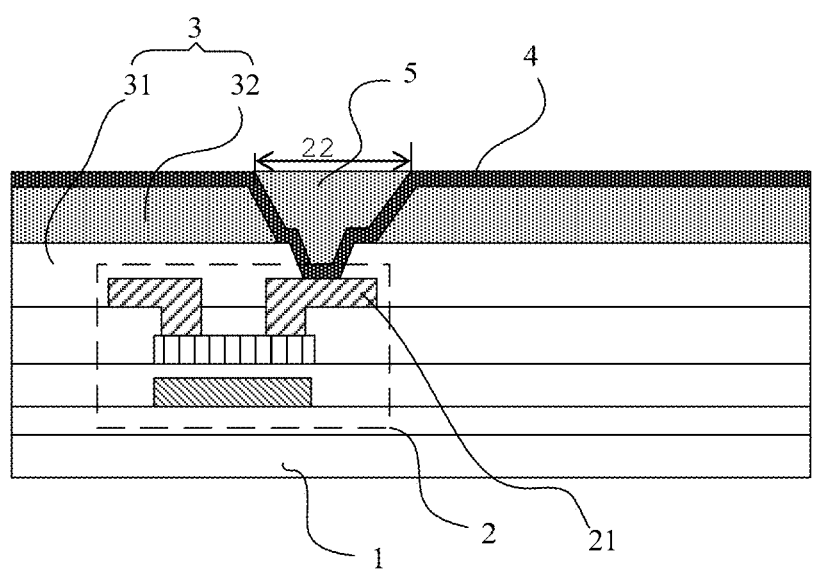
Figure 3H:
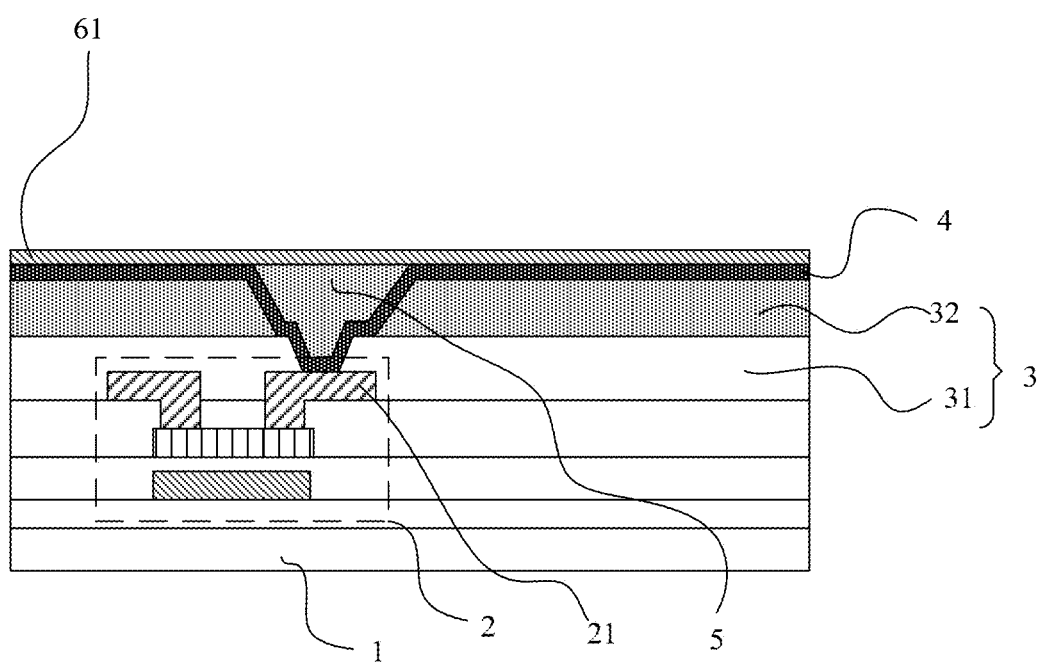
Figure 3I:
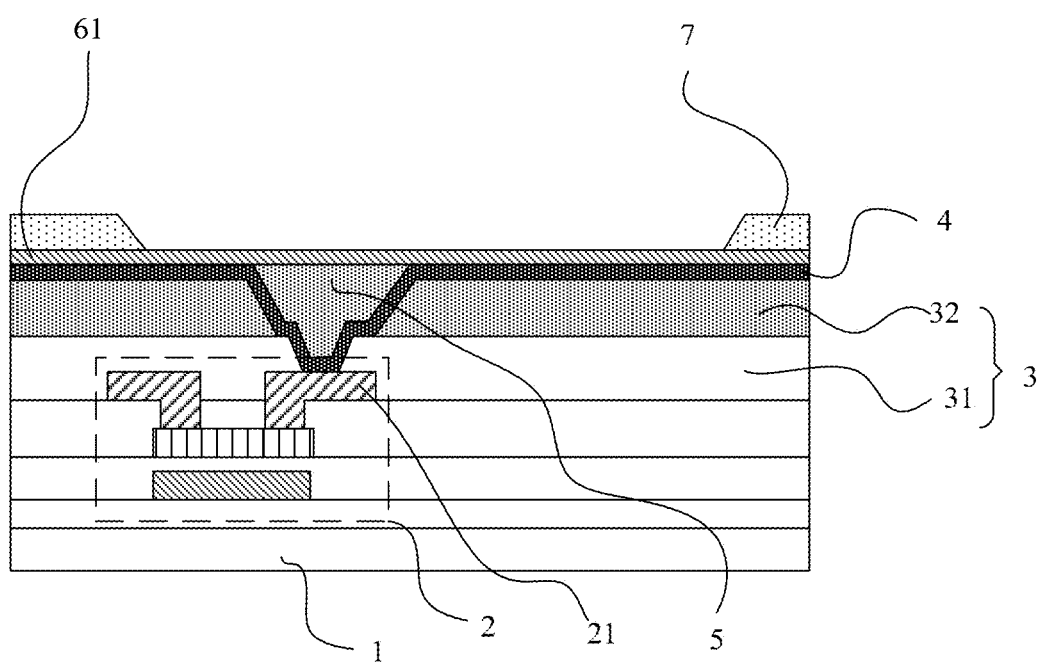
Figure 3J:
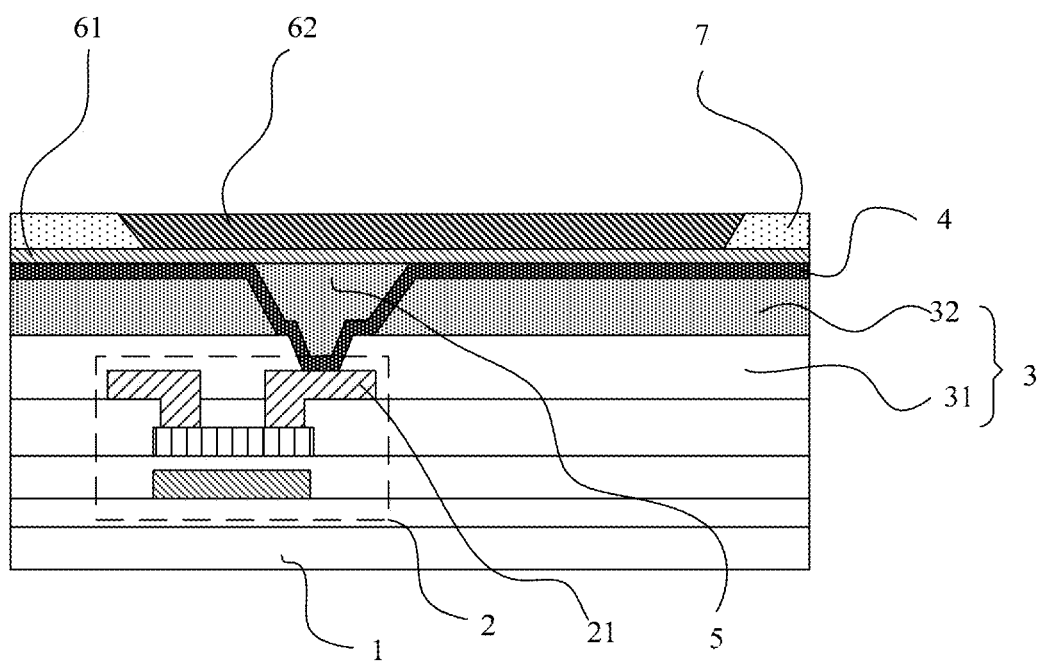

The method for fabricating the array substrate provided by one embodiment of the present disclosure is described herein by using the array substrate shown in FIG. 2 as an example. In one embodiment, the method includes the following steps:

(1) forming a driving transistor 2 on a base substrate 1, as shown in FIG. 3a;

(2) forming an insulating layer 3 on the driving transistor 2, as shown in FIG. 3b;

(3) forming a via hole A in the insulating layer 3 at a position corresponding to the first electrode 21 of the driving transistor 2 through an exposure and development method using a second mask B, as shown in FIGS. 3c and 3d, wherein the photoresist applied before the exposure and development is a first photoresist;

(4) forming a conductive portion 4 on the insulating layer 3 by using a first mask (not shown in the drawing) after the via hole A is formed, wherein the conductive portion 4 is connected to the first electrode 21 of the driving transistor 2 through the via hole A, as shown in FIG. 3e;

(5) forming a resin film layer 51 on the conductive portion 4, and forming a pattern of a filling portion 5 filled within the via hole A by performing an exposure and development on the resin film layer 51 using the second mask B, wherein the photoresist coated before the resin film layer 51 is exposed and developed is a second photoresist, as shown in FIG. 3f and FIG. 3g;

Wherein, the first photoresist and the second photoresist are opposite photoresists regarding the positivity or negativity, that is, the first photoresist is a positive photoresist while the second photoresist is a negative photoresist, or the first photoresist is a negative photoresist while the second photoresist is a positive photoresist;

(6) forming an anode layer 61 electrically connected to the conductive portion 4 on the filling portion 5 and the conductive portion 4 by using the first mask (not shown in the drawing), as shown in FIG. 3h;

(7) forming a pixel defining layer 7 on the anode layer 61 for defining positions at which the light-emitting function layer 62 is in contact with the anode layer 61, wherein an orthographic projection of the opening region formed by the pixel defining layer 7 on the base substrate 1 covers an orthographic projection of the via hole A on the base substrate 1, as shown in FIG. 3i;

(8) forming a light-emitting function layer 62 in the opening region by a printing process, as shown in FIG. 3j; and since the light-emitting function layer 62 is formed by a printing process, it is required that the area of the via hole is flat to ensure a good printing effect, thereby improving the aperture ratio of the array substrate; and (9) forming a cathode layer 63 after the light-emitting function layer 62 is formed, wherein the cathode layer 63 may be disposed over the entire surface as shown in FIG. 2.

Figure 4:
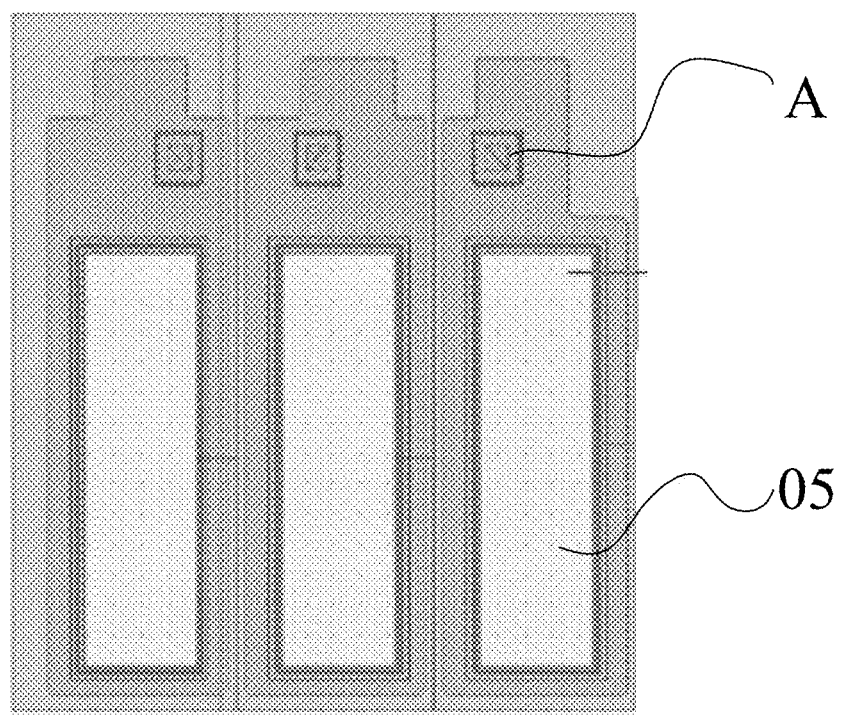
FIG. 4 is a schematic diagram of a top view of an array substrate in the related art.
Figure 5:
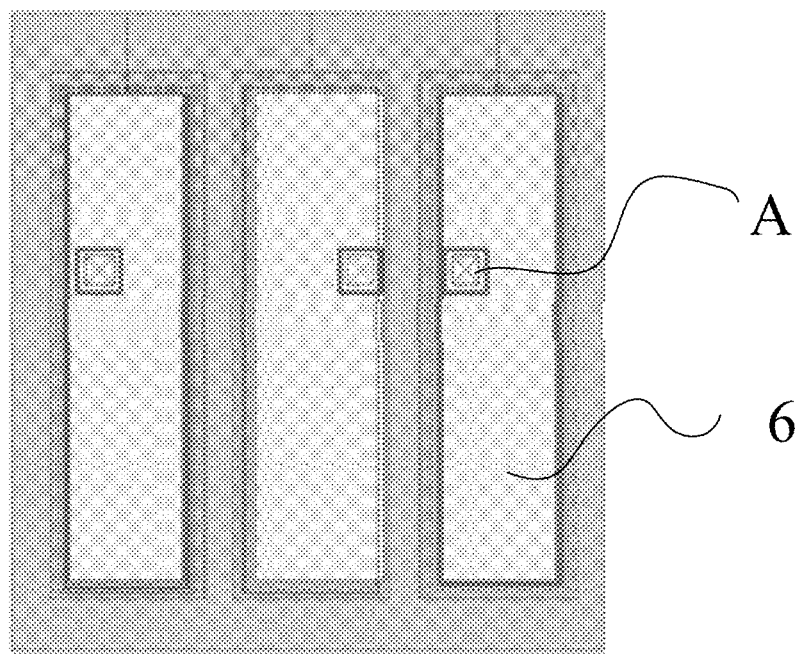
FIG. 5 is a schematic planar structure of an array substrate according to one embodiment of the present disclosure.

FIG. 5 shows a schematic planar structure of the array substrate formed by the above method according to one embodiment of the present application. As shown in FIG. 5, the orthographic projection of the light-emitting device 6 on the base substrate covers the orthographic projection of the via hole A on the base substrate. Compared with the array substrate in the related art as shown in FIG. 4, the pixel aperture ratio of the array substrate provided by the embodiment of the present disclosure can be increased by 20% to 30% compared with that where the light emitting device 05 is only disposed outside the area where the via hole A is located.

In addition, as shown in FIG. 6, since the area where the via A is located does not affect the installation position of the light-emitting device 6, the driving transistors and the power supply signal line 8 and the detection signal line 9 connected to the driving transistors can be disposed between the two adjacent rows of the light emitting devices 6, so that the two adjacent rows of the light emitting devices 6 can share the power signal line 8 and the detection signal line 9, thereby reducing the number of the signal lines.

Based on the same inventive concept, one embodiment of the present disclosure provides a method for fabricating an array substrate, including:

forming a driving transistor on a base substrate;

forming an insulating layer on the driving transistor;

forming a via hole in the insulating layer at a position corresponding to the first electrode of the driving transistor;

forming a conductive portion on the insulating layer after forming the via hole, and the conductive portion is connected to the first electrode of the driving transistor through the via hole;

forming a filling portion at the position of the via hole to fill the via hole;

forming a light emitting device electrically connected to the conductive portion on the filling portion and the conductive portion, wherein an orthographic projection of the light emitting device on the base substrate covers an orthographic projection of the via hole on the base substrate.

Optionally, in the method for fabricating the array substrate provided by one embodiment of the present disclosure, forming the light emitting device electrically connected to the conductive portion on the filling portion and the conductive portion includes:

forming an anode layer, a light emitting functional layer and a cathode layer in sequence on the filling portion and the conductive portion;

Wherein, the anode layer and the conductive portion are formed by the same first mask, and the light-emitting functional layer is formed by a printing process.

Optionally, in the method for fabricating the array substrate provided by one embodiment of the present disclosure, forming the insulating layer and the filling portion includes:

exposing and developing the insulating layer by using the second mask to form a pattern of the insulating layer having a via hole, wherein the photoresist coated before the exposing and developing step is the first photoresist;

forming a resin film layer on a side of the insulating layer opposite from the base substrate;

exposing and developing the resin film layer by using the second mask to form a pattern of the filling portion filling into the via hole, wherein the photoresist coated before the exposing and developing of the resin film layer is the second photoresist;

Wherein, the first photoresist and the second photoresist are positive or negative photoresists opposite to each other.

The specific implementation steps of the fabricating method have been described in detail with the description of the embodiments of the array substrate. Therefore, the method for fabricating the array substrate can be implemented by referring to the embodiments of the array substrate, and the details thereof are not described herein again.

Based on the same inventive concept, one embodiment of the present disclosure further provides a display panel, including the array substrate provided by any of the above embodiments.

Figure 7:
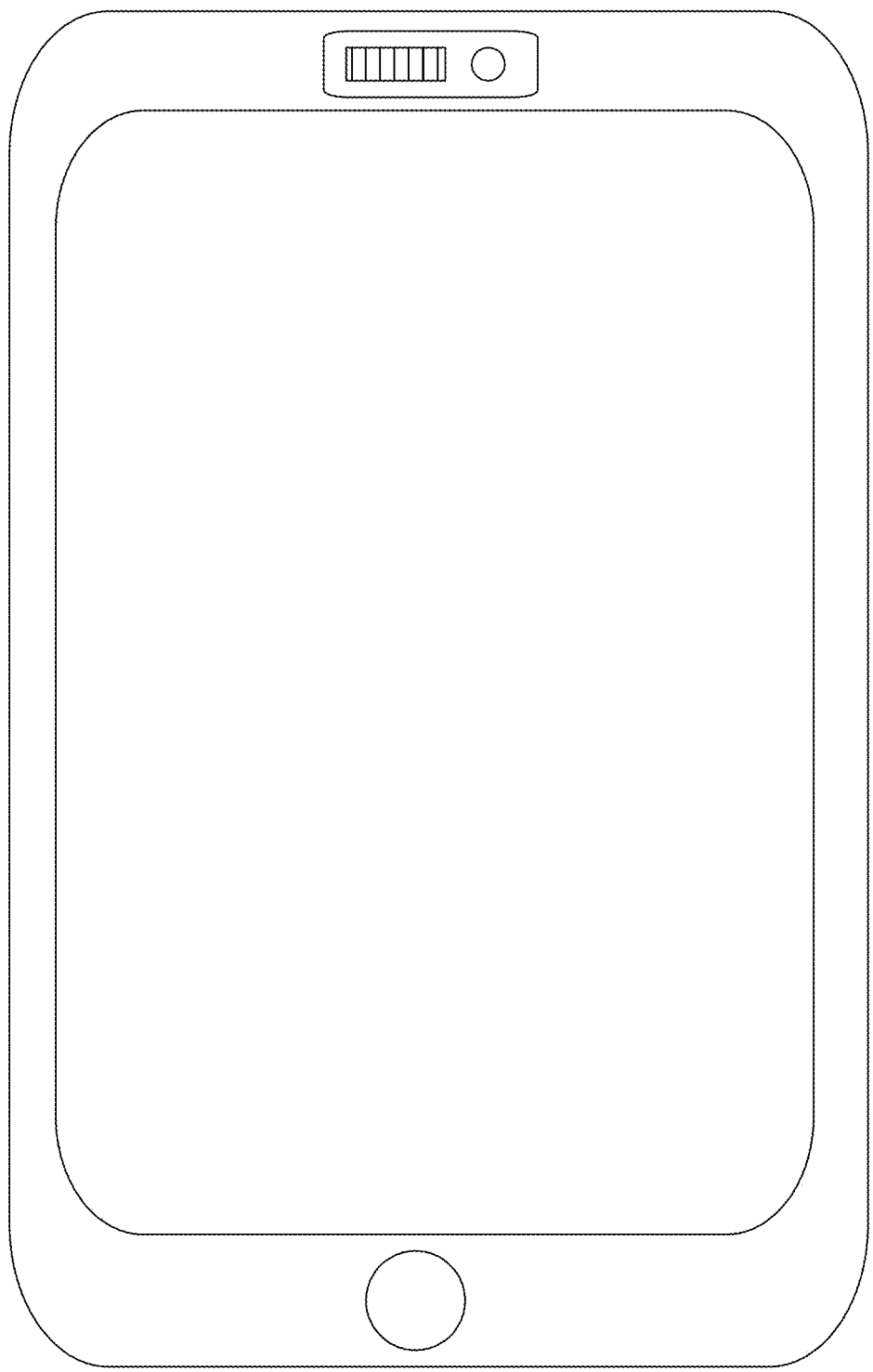
FIG. 7 is a schematic structural diagram of a display apparatus according to one embodiment of the present disclosure.

Based on the same inventive concept, as shown in FIG. 7, one embodiment of the present disclosure further provides a display apparatus, including the display panel provided by any of the above embodiments.

For the implementation of the display panel and the display apparatus, the implementation of the display panel and the display apparatus can be referred to the implementation of the foregoing array substrate, and the repeated description is omitted.

The display apparatus is applicable to various types of displays such as an organic electroluminescence display, an inorganic electroluminescence display, and an Active Matrix/Organic Light Emitting Diode (AMOLED). The display apparatus may be any product or component having a display function, such as a mobile phone, a tablet computer, a television, a display, a notebook computer, a digital photo frame, a navigator, and the like, which is not limited herein.

Embodiments of the present disclosure provide an array substrate, a method of fabricating the same, a display panel, and a display apparatus. The array substrate includes: a base substrate, a driving transistor on the base substrate, an insulation layer on the driving transistor having a via hole on a first electrode of the driving transistor; a conductive portion on the insulating layer, the conductive portion being connected to the first electrode of the driving transistor through the via hole; a filling portion located on the conductive portion and filled in the via hole; a light emitting device located on the filling portion and the conductive portion and electrically connected to the conductive portion, an orthographic projection of the light emitting device on the base substrate covering an orthographic projection of the via hole on the base substrate. The via hole can be filled by the filling portion to form a flattened plane composed of the filling portion and the conductive portion, and then a light emitting device electrically connected to the conductive portion is formed on the plane, so that the light emitting device can be disposed in the area where the via hole is located, thereby increasing the aperture ratio of the pixel and effectively improving the service life of the display panel.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. An array substrate, comprising:
a base substrate;
a driving transistor on the base substrate; and
an insulating layer on the driving transistor;
wherein the insulating layer comprises a via hole; the insulating layer comprises a first insulating layer and a second insulating layer; the first insulating layer is arranged between the driving transistor and the second insulating layer; the first insulating layer comprises a first via hole; the second insulating layer comprises a second via hole; an orthographic projection of the second via hole on the base substrate covers an orthographic projection of the first via hole on the base substrate; and the first via hole and the second via hole are connected to form the via hole;
wherein a first included angle is formed between a side wall of the first via hole and a side wall of the second via hole in a direction perpendicular to the base substrate;
wherein the array substrate further comprises a conductive portion, arranged on the second insulating layer and covering side walls of the first via hole and the second via hole;
wherein the via hole is electrically connected with an anode layer of a light emitting device and a source or drain of the driving transistor;
wherein the array substrate further comprises a filling portion arranged in the via hole; and
wherein a material of the filling portion and a material of the second insulating layer are identical.

2. The array substrate of claim 1, wherein a range of the first included angle is 150-180 degrees.

3. The array substrate of claim 1, wherein a depth of the first via hole is less than a depth of the second via hole along the direction perpendicular to the base substrate.

4. The array substrate of claim 3, wherein a cross-sectional shape of the first via hole and a cross-sectional shape of the second via hole are not similar along the direction perpendicular to the base substrate.

5. The array substrate of claim 1, wherein along the direction perpendicular to the base substrate, a cross-sectional shape of the filling portion in the first via hole and a cross-sectional shape of the filling portion in the second via hole are not similar.

6. The array substrate of claim 1, wherein a material of the filling portion comprises a resin material.

7. The array substrate of claim 1, wherein the conductive portion is electrically connected with the anode layer of the light emitting device and the source or drain of the driving transistor.

8. The array substrate of claim 1, wherein a second included angle is formed between the conductive portion arranged in the first via hole and the conductive portion arranged in the second via hole.

9. The array substrate of claim 8, wherein a range of the second included angle is 150-180 degrees.

10. The array substrate of claim 1, wherein an orthographic projection of the anode layer on the base substrate covers an orthographic projection of the via hole on the base substrate.

11. The array substrate of claim 1, wherein the insulating layer further comprises a third insulating layer;
the third insulating layer is arranged on a side, facing the base substrate, of the first insulating layer;
the third insulating layer comprises a third via hole; and
the source or drain of the driving transistor is at least partially arranged in the third via hole.

12. The array substrate of claim 11, wherein in at least one sub-pixel, compared with an orthographic projection of the via hole on the base substrate, an orthographic projection of the third via hole on the base substrate is farther away from a centre of an opening region of the light emitting device.

13. The array substrate of claim 1, wherein the light emitting device comprises the anode layer, a light-emitting function layer and a cathode layer; wherein at least part of the light emitting functional layer is formed by a printing process.

14. The array substrate of claim 1, wherein an orthographic projection of an opening region formed by a pixel defining layer on the base substrate covers an orthographic projection of the via hole on the base substrate.

15. A display panel, comprising the array substrate according to claim 1.

16. A display apparatus, comprising the display panel according to claim 15.

17. The array substrate of claim 1, wherein shapes of a cross-section of the second via hole and a cross-section of the first via hole are trapezoidal in a direction perpendicular to the substrate, and an edge, close to the first insulating layer, of the cross-section of the second via hole is coincides with an edge, close to the second insulating layer, of the cross-section of the first via hole.

* * * * *

UNITED STATES PATENT AND TRADEMARK OFFICE
CERTIFICATE OF CORRECTION

| | | |
|---|---|---|
| PATENT NO. | : 11,825,700 B2 | |
| APPLICATION NO. | : 17/680790 | |
| DATED | : November 21, 2023 | |
| INVENTOR(S) | : Can Yuan et al. | |

It is certified that error appears in the above-identified patent and that said Letters Patent is hereby corrected as shown below:

On the Title Page

Item (73), the first assignee should read:
Hefei BOE Joint Technology Co., Ltd.

Signed and Sealed this
Fourteenth Day of May, 2024

Katherine Kelly Vidal
*Director of the United States Patent and Trademark Office*